(12) United States Patent
Hovakimyan et al.

(10) Patent No.: US 11,329,633 B2
(45) Date of Patent: May 10, 2022

(54) JOINT OPTIMIZATION OF FIR FILTERS IN A NON-LINEAR COMPENSATOR

(71) Applicant: Tektronix, Inc., Beaverton, OR (US)

(72) Inventors: Karen Hovakimyan, San Jose, CA (US); Pirooz Hojabri, San Jose, CA (US); Tigran Hovakimyan, Yerevan (AM); Norayr Yengibaryan, Yerevan (AM)

(73) Assignee: Tektronix, Inc., Beaverton, OR (US)

( * ) Notice: Subject to any disclaimer, the term of this patent is extended or adjusted under 35 U.S.C. 154(b) by 262 days.

(21) Appl. No.: 15/948,121

(22) Filed: Apr. 9, 2018

(65) Prior Publication Data

US 2019/0312571 A1 Oct. 10, 2019

(51) Int. Cl.
*H03H 17/02* (2006.01)
*G01R 35/00* (2006.01)
*H03M 1/08* (2006.01)

(52) U.S. Cl.
CPC ....... *H03H 17/0219* (2013.01); *G01R 35/005* (2013.01); *H03H 17/0261* (2013.01); *H03M 1/08* (2013.01)

(58) Field of Classification Search
CPC . H03H 17/0219; H03H 17/0261; H03M 1/06; H03M 1/08; H03M 1/1235; H03M 1/12; H03M 1/0626; H03M 1/0614; G01R 35/005
See application file for complete search history.

(56) References Cited

U.S. PATENT DOCUMENTS

2016/0191020 A1* 6/2016 Velazquez .......... H03H 21/0067
341/118

OTHER PUBLICATIONS

Zou et al., Timing Mismatch Compensation in Timing-Interleaved ADCs Based on Multichannel Lagrange Polynomial Interpolation, Apr. 2011, IEEE Transactions on Instrumentation and Measurement, vol. 60, No. 4, pp. 1123-1131 (Year: 2011).*
Lin et al., Digital Filters for High Performance Audio Delta-Sigma Analog-to-Digital and Digital-to-Analog Conversions, Proceedings of ICSP 96, pp. 59-63 (Year: 1996).*
IEEE Xplore Search Results, Apr. 16, 2021, 1 pp. (Year: 2021).*

* cited by examiner

*Primary Examiner* — Toan M Le
(74) *Attorney, Agent, or Firm* — Miller Nash LLP; Andrew J. Harrington (57) ABSTRACT

A mechanism is included for jointly determining filter coefficients for Finite Impulse Response (FIR) filters in a Linear, Memory-less Non-linear (LNL), Linear compensator. Calibration signals are applied to a signal converter input in a test and measurement system. Non-linear signal components are determined in signal output from the signal converter. Non-linear filter components are determined at the LNL compensator based on the calibration signals. The non-linear signal components are then compared to the non-linear filter components. The comparison is then resolved to determine filter coefficients for first stage Finite Impulse Response (FIR) filters and second stage FIR filters in the LNL.

20 Claims, 8 Drawing Sheets

JOINT OPTIMIZATION OF FIR FILTERS IN A NON-LINEAR COMPENSATOR

FIELD OF THE INVENTION

This disclosure is directed to a mechanism for signal processing, and, more particularly, to optimization of signal filters to mitigate non-linear signal components generated by signal processing devices, such as an analog to digital converter (ADC).

BACKGROUND

An analog to digital converter (ADC) is a device with a continuous time input signal (x(t)) with a discrete time output ($y_k$). In other words, the ADC includes an input that receives continuous real values as a function of time and outputs a corresponding sequence of numbers. Accordingly, a theoretical ADC maps each point on an input function to a single output value in a linear fashion. However, real world ADCs introduce some level of non-linear distortion. A compensator that employs a plurality of filters may be employed to correct for such non-linear distortion. Compensation filters may be designed to various lengths and configurations. Further, compensation filters may be of varying size and complexity, require varying levels of power, and result in varying levels of performance. The non-linear nature of compensation filter functionality presents significant optimization challenges when considering such factors.

Aspects of the invention address these and other issues.

DETAILED DESCRIPTION

The operation of an ADC can described mathematically according to Equation 1 below:

$$y_k = P[x(t)], \quad \text{Equation 1}$$

where $y_k$ is the discrete time output of the ADC, x(t) is the continuous time input signal to the ADC, and P[.] is an operator that maps the ADC input function into the ADC output sequence. P[.] is generally smooth, which means that a small change in the input causes a small change in the output of the operator. In addition, the input signal x(t) has some bandwidth limitations and power constraints. Also, linear and non-linear distortion introduced by the operator P[.] is generally time invariant. Non-linear distortion is generally weakly non-linear, meaning that a non-linear portion of a signal are at least by two orders of magnitude smaller than linear portions of a signal. Hence operator P[.] can be described by Volterra series. An ideal ADC can be described according to:

$$y_k = x(kT), \quad \text{Equation 2}$$

such that an ADC output $y_k$ is a sampled version of the input signal x(t) as modified by a scaling variable k over time T. Because of linear and non-linear distortions present in a real ADC, as described by Equation 1, the ADC does not function according to the ideal description expressed by Equation 2.

A compensator may be employed to process the output sequence $y_k$ to produce a new sequence $\hat{x}_k$, such that distortions in $\hat{x}_k$ relative to x(kT) are minimized. A compensator includes an input/output relation that may be described by an operator Q[.] that maps input sequence $y_k$ into the output sequence $\hat{x}_k$:

$$\hat{x}_k = Q[y_k], \quad \text{Equation 3}$$

where all variables are as described above. The operator Q[.] may be minimized by selecting compensator filters according to a least mean square criteria according to Equation 4:

$$\Sigma_k (\hat{x}_k - x(kT))^2, \quad \text{Equation 4}$$

Minimization of Equation 4 should be considered for all possible input signals x(t) with certain restrictions on the signal bandwidth and power. It should be noted that the output sequence $\hat{x}_k$ may be delayed relative to the input signal samples x(kT) because of delays in the ADC as well as delays in the compensator. For simplicity of notations this delay operator is not expressly included in the Equations above. The compensator may employ any type of non-linear operator, as desired, to mitigate non-linear distortion caused by the ADC. For example, a compensator can be designed to operate according to a Volterra series. However, such a compensator may require complicated structures with correspondingly high power consumption and large circuit board size. In another example, a compensator may include linear filters with multiplication operations implemented on these filters' inputs and outputs. As such, it is desirable to determine compensator block structures of reasonable complexity with parameters that minimize Equation 4.

In other words, a compensator including linear and non-linear filters can mitigate distortion caused by an ADC and/or a DAC, and hence cause the ADC/DAC to act in a substantially ideal manner as described by Equation 2. However, the task of determining an optimal set of filters that are minimally complex and still compensate for distortion over a wide range of input signals is exceedingly difficult and implementation specific.

Disclosed herein is a mechanism to optimize parameters for a LNL compensator for use in conjunction with a signal converter (e.g. an ADC or a DAC). The LNL compensator may contain a plurality of branches to mitigate corresponding orders of linear and non-linear components. In some examples, each of the branches include a first stage finite impulse response filter (FIR) a nonlinear filter, and a second stage FIR. In other examples, a single first stage FIR filter is common to multiple branches. In either case, the FIR filters can be of various lengths, contain various numbers of taps, and contain many combinations of FIR filter coefficients. The disclosed mechanism jointly/simultaneously optimizes the first stage FIR filters and the second stage FIR filters. Specifically, the mechanism applies calibration signals, including mixes of sine wave tones at various frequencies, to the ADC input. The mechanism then measures and determines the non-linear components in the ADC output and compares them to modeled LNL filters. The LNL filters are modeled by maintaining the FIR coefficients of the first stage FIR filters and the second stage FIR filters as unknown variables. The modeled LNL filters are then equated to the non-linear signal components using a least mean square formulation. To optimize complexity, a minimum performance threshold may be received from a user. The lengths of the FIR filters can be varied and to determine the minimum lengths of the first stage FIR filters and the second stage FIR filters to meet the minimum performance threshold. The number of FIR filters may also be varied and performance determined. The minimum length of the FIR filters can then be selected that meets the minimum performance threshold. Further, cross-products can be removed from the second stage FIR filters. For example, cross-products can be ranked based on resulting performance degradation. Cross-products can then be removed from the second stage FIR filters until the minimum performance threshold is met. As used herein, meeting a threshold indicates that complexity of a corresponding component is reduced until further reduction would result in performance dropping below a corresponding threshold. Once the number and length of FIR filters is determined and the number of cross-products are determined, the coefficients for the FIR filters are determined. For example, a Jacobian matrix may be determined for the LNL compensator. An iterative solution mechanism may then employ the Jacobian matrix and the formulation of the LNL compensator in least mean square form, including FIR filter number, length, and cross-products, to determine the FIR coefficients. The result is an LNL compensator where the first stage FIR filters and the second stage FIR filters have been jointly optimized to provide the requested performance with minimal complexity and/or power consumption.

Figure 1:
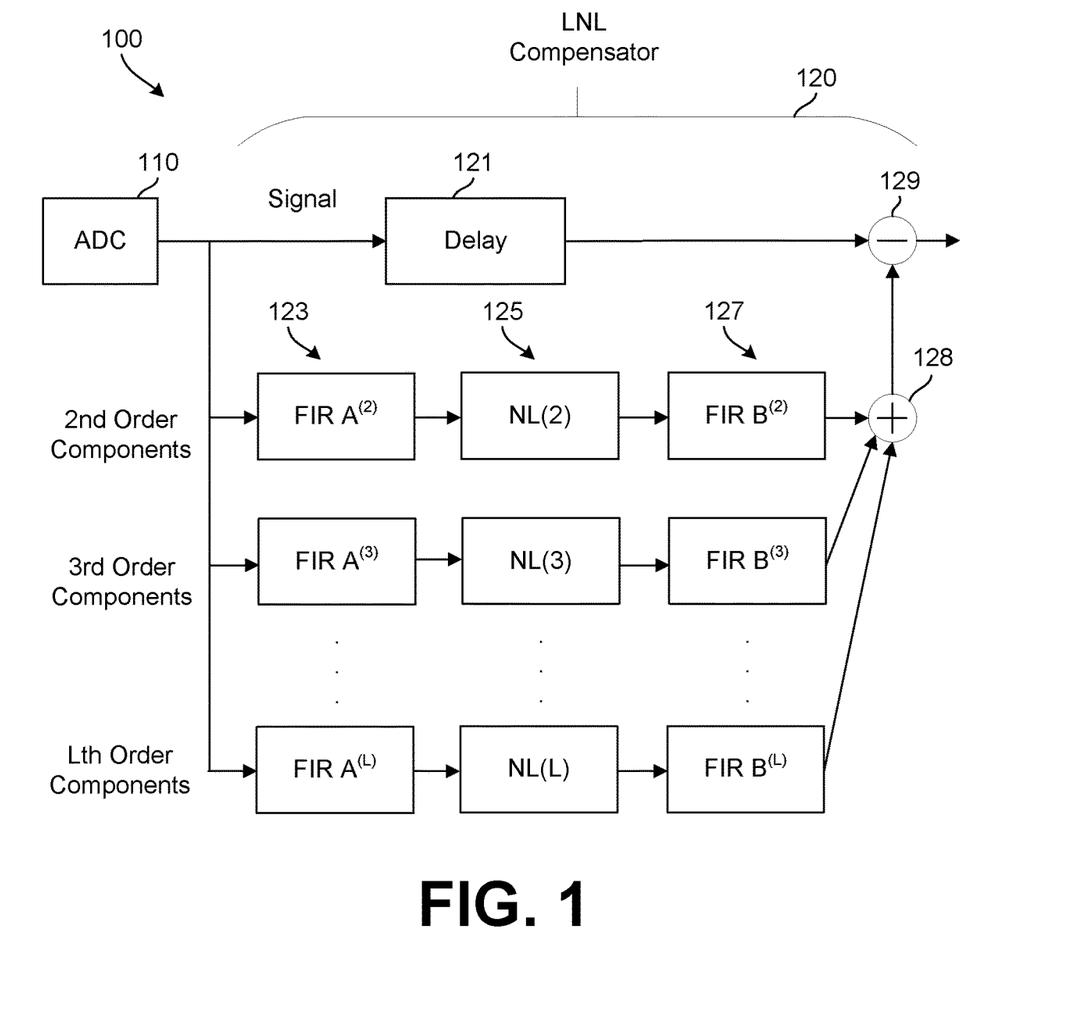
FIG. 1 is a schematic diagram of an example test and measurement system employing a Linear, Memory-less Non-linear, Linear (LNL) compensator.

FIG. 1 is a schematic diagram of an example test and measurement system 100 employing a LNL compensator 120. The system 100 includes an ADC 110, which may be any device configured to sample an analog input signal and output a digital value. The ADC 110 may be described according to Equation 1. As noted above, the ADC 110 may introduce some non-linear signal components when converting the analog signal into the digital signal. Accordingly, system 100 includes a LNL compensator 120 to mitigate such non-linear signal components. As such, the LNL compensator 120 operates according to Equation 3. It should be noted that the LNL compensator 120 may post-compensate for an ADC 110 and/or pre-compensate for a DAC. As used herein, the term signal converter is intended to refer to either an ADC or a DAC.

The LNL compensator 120 is implemented according to a parameterized Wiener-Hammerstein model (e.g. a Linear dynamic 1-Memory less Non-Linear-Linear dynamic 2, design). The LNL compensator 120 can be implemented in hardware, for example by employing an application specific integrated circuit (ASIC), a field programmable gate array (FPGA), etc. The LNL compensator 120 may also be implemented in a digital signal processor (DSP) as part of a digital post-processing mechanism. The LNL compensator 120 includes a first order branch for propagating the converted signal. The first order branch includes a delay 121 block that delays the signal while the non-linear components of the signal are processed. The first order branch also includes a subtraction component 129. The non-linear components of the signal are conditioned by the lower branches of the LNL compensator 120 and then subtracted from the signal at the subtraction component 129. In other words, the lower branches of the LNL compensator 120 generate an inverse of the non-linear components and add the inverse back to the signal. This results in the removal of the non-linear components from the signal due to destructive interference. Such process may also be realized in the post processing domain by subtraction operators.

The lower branches of the LNL compensator 120 include three stages, a first stage FIR filter 123, a non-linear filter 125, and a second stage FIR filter 127. The first stage FIR filter 123 includes one or more parallel FIR filters. The non-linear filter 125 includes a multiplication of first stage outputs and a selection mechanism for selecting at least one of the multiplied first stage outputs. The second stage FIR filter 127 includes one or more parallel FIR filters. The outputs of the second stage FIR filters 127 are added by an addition component 128 and then subtracted from the delayed ADC 110 output signal by the subtraction component 129. As shown, there may be L orders of non-linear signal components. Hence, the LML compensator 120 may include L branches of to filter out such components, where each branch includes a first stage FIR filter 123, a non-linear filter 125, and a second stage FIR filter 127. As such, each branch is configured to filter out a corresponding order of non-linear signal components. Such filters are discussed in greater detail below.

It should be noted that the test and measurement system 100 may be implemented in an oscilloscope, an arbitrary waveform generator (AWG), a transmitter (TX), or other test systems. For example, the system 100 and/or LNL compensator 120 may be implemented as a pre-distortion stage in a DSP and applied before an output stage. As a particular example, the system 100 and/or LNL compensator 120 may operate in a digital to analog converter (DAC), a driver, etc. Further, the LNL compensator 120 may operate as a hardware circuit, such as a processor, a DSP, an ASIC, an FPGA, etc. on such a test system. In other examples, the LNL compensator 120 may be implemented by a computer program product stored in memory and executed on a processor. Such memory may include any computer-readable storage medium, such as cache, flash memory, solid state memory, read only memory (ROM), Random Access Memory (ROM), EEPROM, or other memory types.

Figure 2:
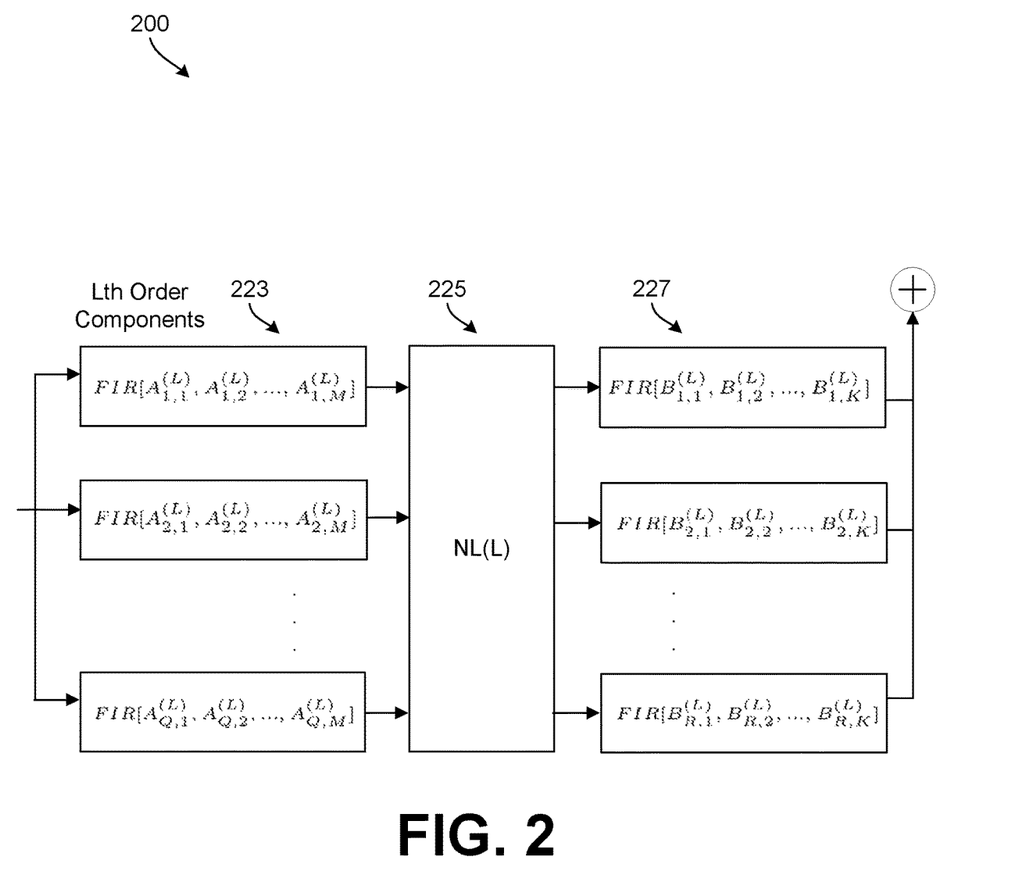
FIG. 2 is a schematic diagram of an example LNL compensator branch.

FIG. 2 is a schematic diagram of an example LNL compensator branch 200. For example, the LNL compensator branch 200 may implement an Lth order branch of the LNL compensator 120 of FIG. 1. It should be noted that the LNL compensator branch 200 can be configured to implement any order branch by including a corresponding number of parallel filters. The LNL compensator branch 200 includes first stage FIR filters 223, a non-linear filter 225, and a second stage FIR filter 227, which may be substantially similar to the first stage FIR filters 123, the non-linear filters 125, and the second stage FIR filters 127, respectively. Specifically, the first stage FIR filters 223 may include Q filters each with M taps. Hence, the first stage FIR filters 223 can be described by a matrix of $Q^M$ FIR coefficients where a matrix element $A_{qm}^{(l)}$ includes the mth coefficient of the qth filter in the array of FIR filters for the l-th order branch. Similarly the second stage FIR filters 227 may be described by a matrix of $R^K$ FIR coefficients where a matrix element $B_{rk}^{(l)}$ includes the kth coefficient of the rth filter for the l-th order branch in the array of second stage FIR filters 227. A denotes the first stage FIR filter 223 and B denotes the second stage FIR filter 227, respectively. A memoryless non-linear filter 225 block is located between these two linear stages. The Lth order non-linear filter 225, denoted NL(L), accepts outputs from the first stage FIR filters 223, designated herein as inp(q), at the qth filter output. The Lth order non-linear filter 225 forms products of order L, designated as out(r), to input into the rth filter of the second stage FIR filters 227. The non-linear filter 225 can be described according to Equation 5:

$$out(r) = \Pi_{q=1}^{Q} inp(q)^{l_q}, \quad \text{Equation 5}$$

where all variables are as discussed above and where $l_q$ are non-negative integers defined according to Equation 6:

$$\Sigma_{q=1}^{Q} l_q = l, \quad \text{Equation 6}$$

It should be further noted that the number of different l-th order products $R^{(l)}$ from Q inputs is described by Equation 7:

$$R_0^{(l)} = \frac{(Q + l - 1)!}{l!(Q - 1)!}, \quad \text{Equation 7}$$

It should be noted that $R^{(l)} \leq R_0^{(l)}$ products are formed by the memoryless non-linear filter 225 according to an l-dimensional array S having 0 and 1 entries. It should also be noted that the l-dimensional array S entries are bound by the following rule: The l-th order product is formed only for those inputs $in(q_1), in(q_2), \ldots, in(q_l); q_k \in \{1, 2, \ldots, Q\}$ for which $S_{q_1 q_2 \ldots q_l} = 1$. Further, indexes $q_1, q_2, \ldots, q_l$ need not be different. The non-linear filter 225 is discussed in greater detail below.

Figure 3:
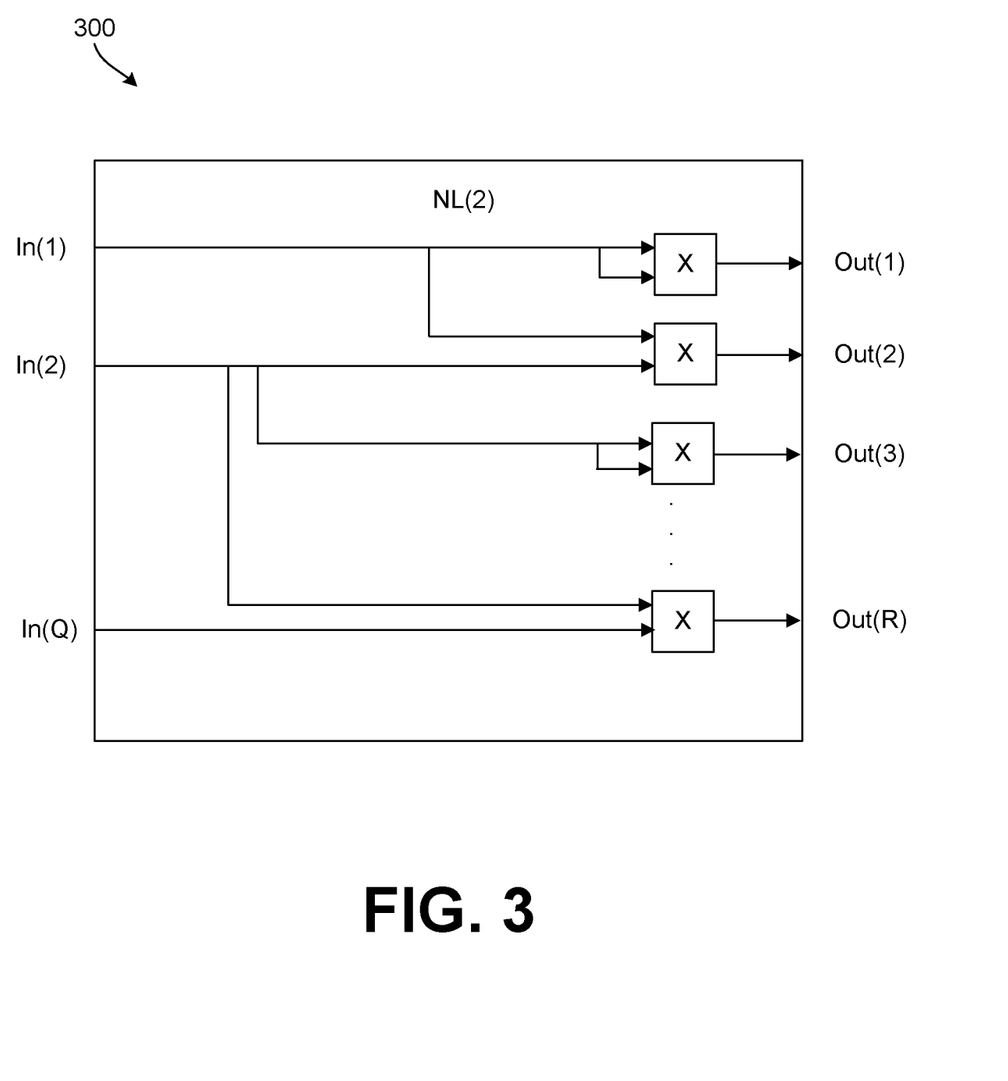
FIG. 3 is a schematic diagram of an example non-linear filter block.

FIG. 3 is a schematic diagram of an example non-linear filter block 300. For example, the non-linear filter block 300 may implement the non-linear filter 125 of FIG. 1 and/or the non-linear filter 225 of FIG. 2. The non-linear filter block 300 is depicted as a second order filter (e.g. l-th order where l equals two). As shown, the non-linear filter block 300 receives Q inputs from first stage FIR filters. Each input is multiplied by itself and the result output. Also, each input is multiplied by an adjacent input and the result output The outputs are then forwarded to a second stage FIR filter. Additional multiplications may be included to enable higher order non-linear filters.

Figure 4:
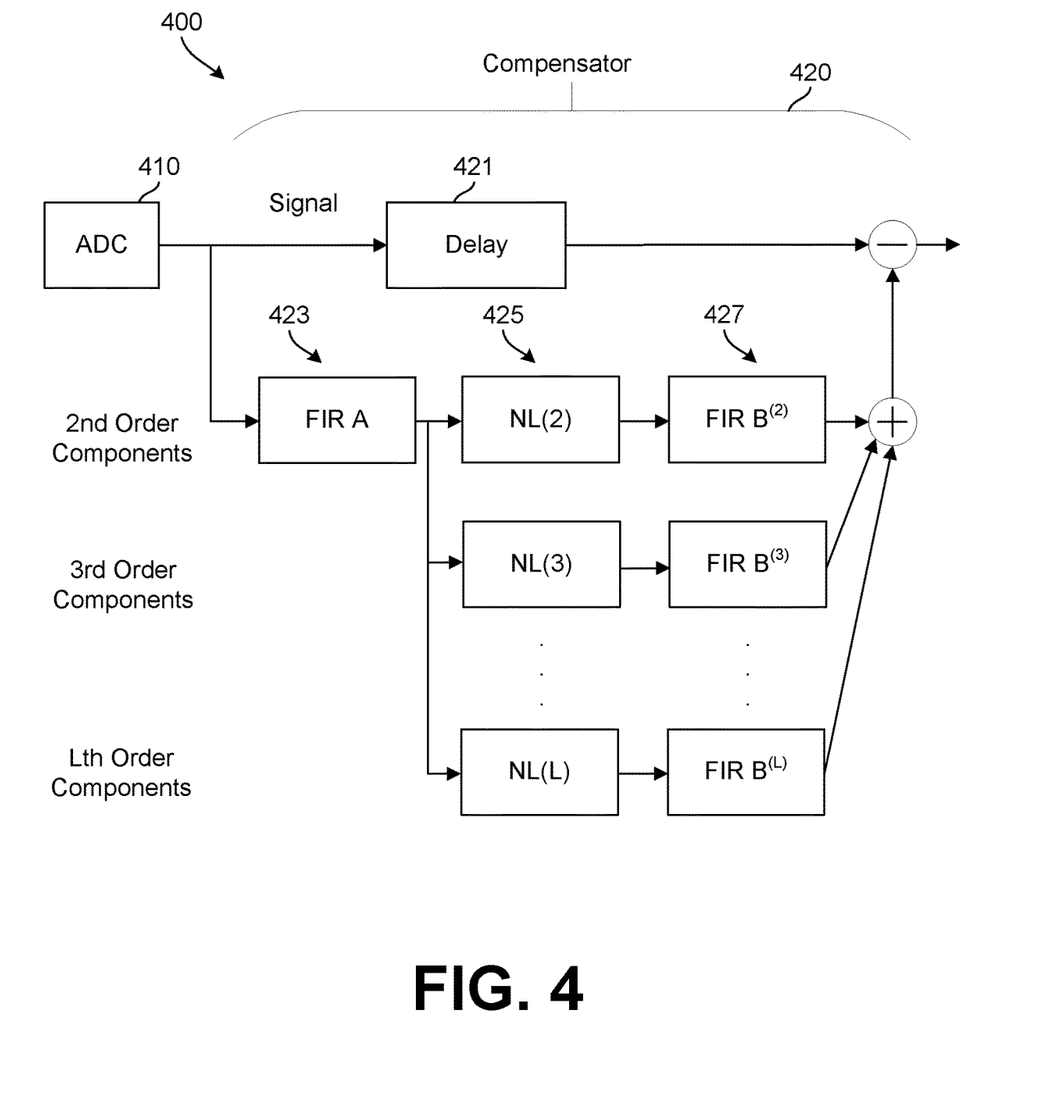
FIG. 4 is a schematic diagram of a test and measurement system employing another example LNL compensator.

FIG. 4 is a schematic diagram of a test and measurement system 500 employing another example LNL compensator 420. System 500 includes an ADC 410, which is substantially similar to ADC 110. System 500 also includes a compensator 420 with a single first stage FIR filter 423 and a plurality of branches, each branch including a non-linear filter 425 and a second stage FIR filter 427. The first stage FIR filter 423, the non-linear filter 425, and the second stage FIR filter 427 may be substantially similar to the first stage FIR filter 123, the non-linear filter 125, and the second stage FIR filter 127, respectively, of FIG. 1. Unlike compensator 120, the first stage FIR filter 423 is employed to filter all signal components with an order in excess of one. The LNL compensator 420 is otherwise substantially similar to the LNL compensator 120.

As can be seen from FIGS. 1-4, the LNL compensator includes varying numbers of first stage FIR filters and second stage FIR filters, all with varying lengths (e.g. number of taps) and all employing varying filter coefficients. The LNL compensator also includes varying orders of non-linear filters between the first stage FIR filters and the second stage FIR filters. The disclosed mechanisms are provided to optimize the LNL compensator by jointly determining appropriate filter coefficients for the first stage FIR filters and the second stage FIR filters for a corresponding ADC. In other words, the first stage FIR filters and the second stage FIR filters are determined together instead of determining first stage FIR filter coefficients and then determining second stage FIR filter coefficients based on the previously determined first stage FIR filter coefficients. The mechanisms described below optimize filter coefficient determination for the structures discussed above. Specifically, a calibration mechanism is employed to model the LNL compensator as a system of equations as discussed below with respect to FIG. 5. The LNL compensator FIR filters are then varied in length and number to arrive at structure that meets a minimum performance threshold as discussed below with respect to FIG. 6. Finally, a mechanism determines FIR coefficients for the FIR filter stages based on the previously determined FIR filter length and number as discussed below with respect to FIG. 7.

Figure 5:
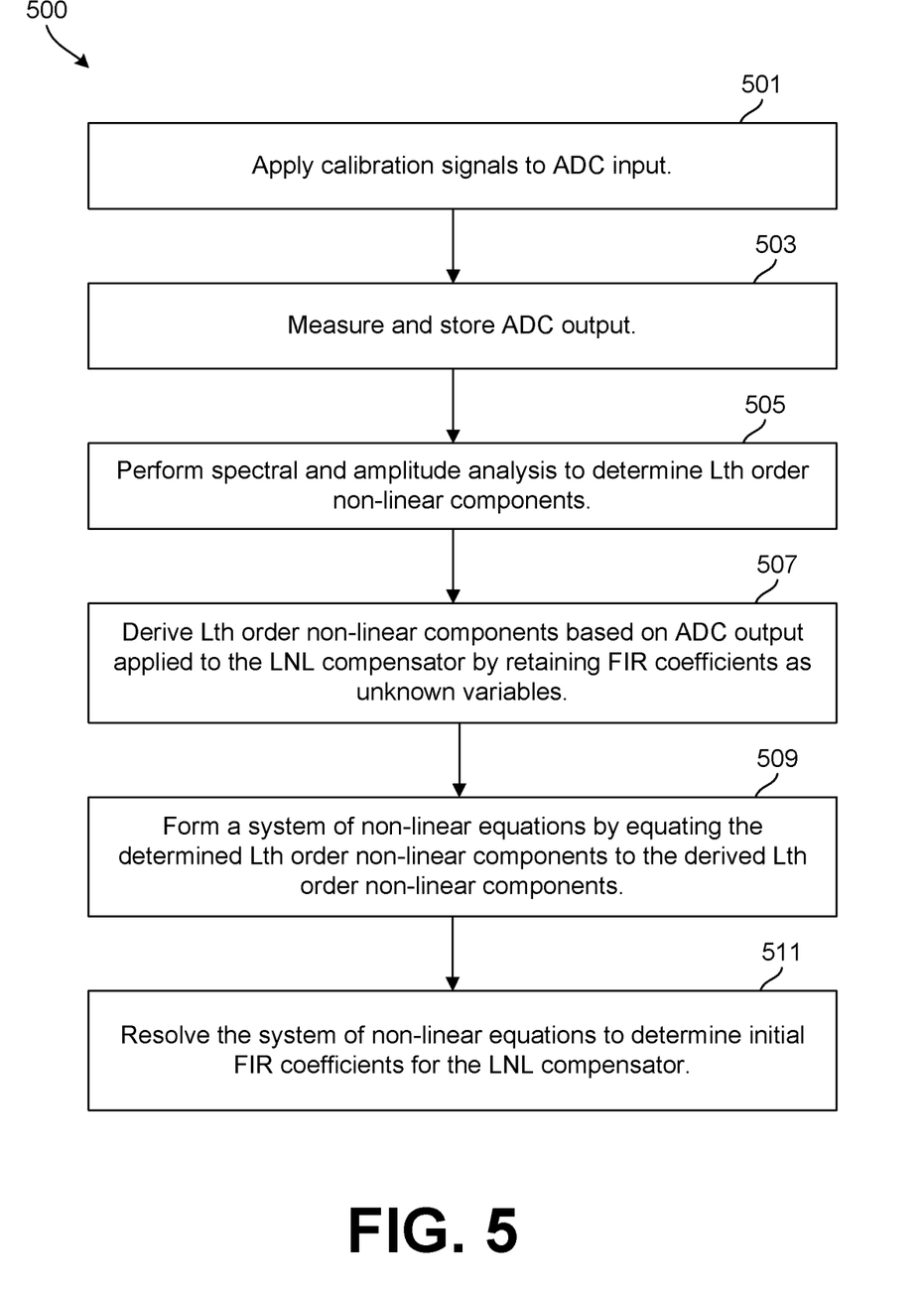
FIG. 5 is a flowchart of an example method for calibrating a LNL compensator to describe finite impulse response (FIR) coefficients.

FIG. 5 is a flowchart of an example method 500 for calibrating a LNL compensator, such as LNL compensator 120 and/or 420, to describe FIR coefficients. The goal of calibration is to make decision on a number and length of the first and second stage FIR filters in the LNL compensator. The FIR filter coefficients can then be optimized along with the array S describing the non-linear filter. To achieve this goal, calibration signals are applied at an ADC input. Digitized data is then acquired at the ADC output. The acquired data is processed to optimize parameters of the LNL compensator as described below.

At block 501, calibration signals are applied to an ADC input in a test and measurement system. The calibration signals may include mixtures of sine wave tones at a plurality of frequency indexes. The calibration signals are selected according to Equation 8 below. Specifically, for an Lth order path calibration of an LNL compensator, a set of calibration signals are employed that each include up to L sinewave tones according to:

$$u(\tau) = \sum_{k=1}^{l} u_{c_k} e^{\frac{j2\pi c_k \tau F_S}{N_0}} + \sum_{k=1}^{l} (u_{c_k})^* e^{\frac{-j2\pi c_k \tau F_S}{N_0}}, \quad \text{Equation 8}$$

where $c_k$, $k=1, 2, \ldots, l$ are the frequency indexes of the calibration signal tones; $u_{c_k}$ is the complex amplitude of the tone with the frequency index $c_k$; $(u_{c_k})^*$ is amplitude's complex conjugate, $F_s$ is the sampling rate of the ADC; $N_0$ is an integer used for Discrete Fourier Transform (DFT) processing of the discrete time signal at the ADC output; and $\tau$ is a time variable. The set of calibration signals are sequentially applied.

At block 503, the signal output from the ADC is measured and stored. For example, the signal output may be measured/stored in the time domain.

At block 505, spectral and/or amplitude analysis is performed on the measured signals to determine the non-linear signal components in the signal output. Stated formally, for an Lth order LNL compensator, the Lth order non-linear signal components are found. Specifically, each non-linear component may be found at a specific frequency mix according to $\Sigma_{k=1}^{l} n_k$ where $n_k \in \{-c_l, -c_{l-1}, \ldots, c_1, c_1, c_2, \ldots, c_l\}$, $k=1, 2, \ldots, l$). In other words, the frequency mix is summed across the frequency indexes of the calibration signal tones for each base frequency from one to l, where the base frequencies are mixed with secondary frequencies of indexes selected from −l to positive l for an l-th order LNL compensator.

At block 507, the non-linear filter components are modeled at LNL compensator based on the calibration signals. In other words, Lth order non-linear components are derived based on the ADC output applied to the LNL compensator. Stated formally, expressions are determined for the corresponding non-linear filter components for the same frequency mixes as in block 505. Such expressions can be generated by l-th branch of the LNL compensator when the measured ADC outputs are applied to the l-th branch of LNL. The FIR filter coefficients are retained as unknown variables/parameters in these expressions. In other words, when modeling the non-linear filter components, the first stage FIR filters and the second stage FIR filters are modeled as a series of unknown FIR coefficients. It should be noted that blocks 505 and 507 may be completed in any order and/or in parallel.

At block 509, the non-linear signal components measured at block 505 are compared to the non-linear filter components modeled/determined at block 507. For example, a system of equations may be formed by equating the derived expressions to the corresponding non-linear components for each frequency mix. One equation may be employed for each frequency mix. As such, an over-determined set of non-linear equations are determined. Such non-linear equations can be resolved in least square sense at block 511 to find the unknown FIR coefficients. In other words, comparing the non-linear signal components to the non-linear filter components includes comparing the non-linear signal components to the non-linear filter components according to a least mean squared formulation.

At block 511, the comparison of the non-linear signal components to the non-linear filter components at block 509 is resolved as a system of non-linear equations. Resolving such equations results in determining initial FIR coefficients for the LNL compensator. Accordingly, resolving such equations jointly determines filter coefficients for first stage FIR filters and second stage FIR filters in the LNL.

Following the calibration steps described above, the resulting function(s) may be optimized by minimization. For example, a function for the l-th branch of the LNL compensator can be expressed for minimization according to:

$$F((A^{(l)}, B^{(l)}, S^{(l)}) = \|W^{(l)} g(A^{(l)}, B^{(l)}, S^{(l)}) - d^{(l)}\|_2^2, \quad \text{Equation 9}$$

where $\|\cdot\|_2$ denotes a Euclidean norm; $W^{(l)} \in \mathbb{C}^{N_l \times P_l}$ with $N_l$ indicating the number of equations derived per the calibration mechanism of method 500, $P_l = K M^l$, and $W^{(l)}$ includes entries according to Equation 10:

$$W_{np}^{(l)} \propto e^{-j2\pi p_0 (\Sigma_{k=1}^{l} n_k)/N_0} \Pi_{k=1}^{l} (u_{n_k} e^{-j2\pi p_k n_k/N_0}), \quad \text{Equation 10}$$

where $n_k$ is the kth tone index in the calibration signal; $p_0 \in \{1, 2, \ldots, K\}$, $p_k \in \{1, 2, \ldots, M\}$ for $k = 1, 2, \ldots, l$; $u_{n_k}$ is the DFT value of data captured at ADC output at frequency index $n_k$; $N_0$ is the DFT processing length and $$\sigma(n_1, n_2, \ldots, n_l) = \frac{l!}{\prod_{k=1}^{l} \mu_k(n_1, n_2, \ldots, n_l)!}, \quad \text{Equation 11}$$

where $\mu_1(n_1, n_2, \ldots, n_l)$ is the number of maximum identical tones in a calibration signal with tones indexes $n_1, n_2, \ldots, n_l$; $\mu_2$ is the number of maximum identical tones neglecting $\mu_1$ identical tones found first, and so forth.

Indexes n, p of the matrix W enumerate l-tuple $n_1, n_2, \ldots, n_l$ and l+1 tuple $p_0, p_1, \ldots, p_l$ correspondingly:

$$n = \text{enum}(n_1, n_2, \ldots, n_l), \quad \text{Equation 12}$$

$$p = \text{enum}(p_0, p_1, \ldots, p_l), \quad \text{Equation 13}$$

Also, $g(A^{(l)}, B^{(l)}, S^{(l)}) \in \mathbb{R}^{P \times 1}$, $P = KM^l$ with the pth component according to:

$$g_p(A^{(l)}, B^{(l)}, S^{(l)}) = \Sigma_{q_1=1}^{Q} \Sigma_{q_2=1}^{q_1} \cdots \Sigma_{q_l=1}^{q_{l-1}} S_{q_1 q_2 \ldots q_l} A_{q_1 p_1}^{(l)} \ldots A_{q_l p_l}^{(l)} B_{r p_0}^{(l)}, \quad \text{Equation 14}$$

$$r = \text{enum}(q_1, q_2, \ldots, q_l), \quad \text{Equation 15}$$

where the enumeration of Equation 13 is employed for index p.

Further $d^{(l)} \in \mathbb{R}^{N_l \times 1}$ is the vector presenting the delayed l-th order non-linear terms, with frequency mixes $\Sigma_{k=1}^{l} n_k$, at the ADC output with components according to:

$$d_n^{(l)} = v_n^{(l)} e^{-j2\pi(\Sigma_{k=1}^{l} n_k) \text{Delay}/N_0}, \quad \text{Equation 16}$$

where a programmable integer parameter (Delay) is a delay in samples introduced by the delay block 121, $v_n^{(l)}$ are DFT values of ADC output at frequency mix $\Sigma_{k=1}^{l} n_k$ and enumeration given by Equation 12 is employed for index n.

It should be noted that l-th order terms $v_n^{(l)}$ can be found through Volterra kernels estimation in case of multiple order non-linearities. Such terms may also be found through direct calculation of DFT values of ADC outputs at frequency mixes $\Sigma_{k=1}^{l} n_k$ when only up to one even order and one odd order non-linearities dominates in the system (e.g. second and third order). For example, the separation of non-linear terms of different order can be achieved by choosing odd frequency indexes for calibration signals.

The optimization problem for the l-th order non-linearity can be formulated as:

$$\min_{A^{(l)}, B^{(l)}, S^{(l)}} F(A^{(l)}, B^{(l)}, S^{(l)}), \quad \text{Equation 17}$$

where function F is as defined through Equations 9-16.

A more general optimization problem, corresponding to the LNL compensator of FIG. 4, can be expressed as:

$$\min_{A, B^{\{l\}}, S^{\{l\}}} F_c(A, B^{\{l\}}, S^{\{l\}}), \quad \text{Equation 18}$$

$$F_c(A, B^{\{l\}}, S^{\{l\}}) = \Sigma_{l=1}^{L} \gamma_l F(A, B^{(l)}, S^{(l)}), \quad \text{Equation 19}$$

where A is the common first linear stage; $B^{\{l\}}$, $S^{\{l\}}$ stand for the sets of $\{B^l, l = 1, 2, \ldots, L\}$ and $\{S^l, l = 1, 2, \ldots, L\}$ correspondingly and $\gamma_l$ is the weighting factor for the Lth order non-linear branch, such that:

$$\Sigma_{l=2}^{L} \gamma_l = 1, \quad \text{Equation 20}$$

The minimization problem of Equations 18-19 is more general than the minimization problem of Equation 17 since the problem of Equation 17 can be derived from Equation 19 by setting $\gamma_l = 1$ for any specific $l = l_1$ and setting all other $\gamma_l = 0$, $l \neq l_1$ Included below is a mechanism to resolve the more general optimization problem of Equations 19-20. Specifically, the optimization function of Equation 19 can be recast in the form:

$$F_c(A, B^{\{l\}}, S^{\{l\}}) = \|Wg(A, B^{\{l\}}, S^{\{l\}}) - d\|_2^2, \quad \text{Equation 21}$$

where W is a block diagonal matrix according to:

$$W = \begin{bmatrix} \gamma_2^{0.5} W^{(2)} & \cdots & 0_{N_2 \times KM^L} \\ \vdots & \ddots & \vdots \\ 0_{N_L \times KM^2} & \cdots & \gamma_L^{0.5} W^{(L)} \end{bmatrix},$$

Equation 22 and where $(A, B^{\{l\}}, S^{\{l\}})$, d are column vectors according to:

$$g(A, B^{\{l\}}, S^{\{l\}}) = \begin{bmatrix} g(A, B^{(2)}, S^{(2)}) \\ \vdots \\ g(A, B^{(L)}, S^{(L)}) \end{bmatrix},$$

Equation 23

$$d = \begin{bmatrix} \gamma_2^{0.5} d^{(2)} \\ \vdots \\ \gamma_L^{0.5} d^{(L)} \end{bmatrix},$$

Equation 24

A lower bound may be determined based on the optimization function of Equation 21. This informs a procedure for selecting a number of FIR filters and corresponding FIR filter lengths in the linear stages of LNL compensator. The lower bound may be described according to:

$$\hat{F}_c(z) = \|Wz - d\|_2^2,$$

Equation 25 where independent variable z has the same dimension as a column vector $g(A, B^{\{l\}}, S^{\{l\}})$ in Equation 23. The optimization function of Equation 25 is convex and the global minimum can be found. The optimization function can be restated as:

$$z_0 = \arg(\min\{\hat{F}_c(z)\}),$$

Equation 26

$$F_c(A, B^{\{l\}}, S_{\{l\}}) \geq \|Wz_0 - d\|_2^2,$$

Equation 27

Figure 6:
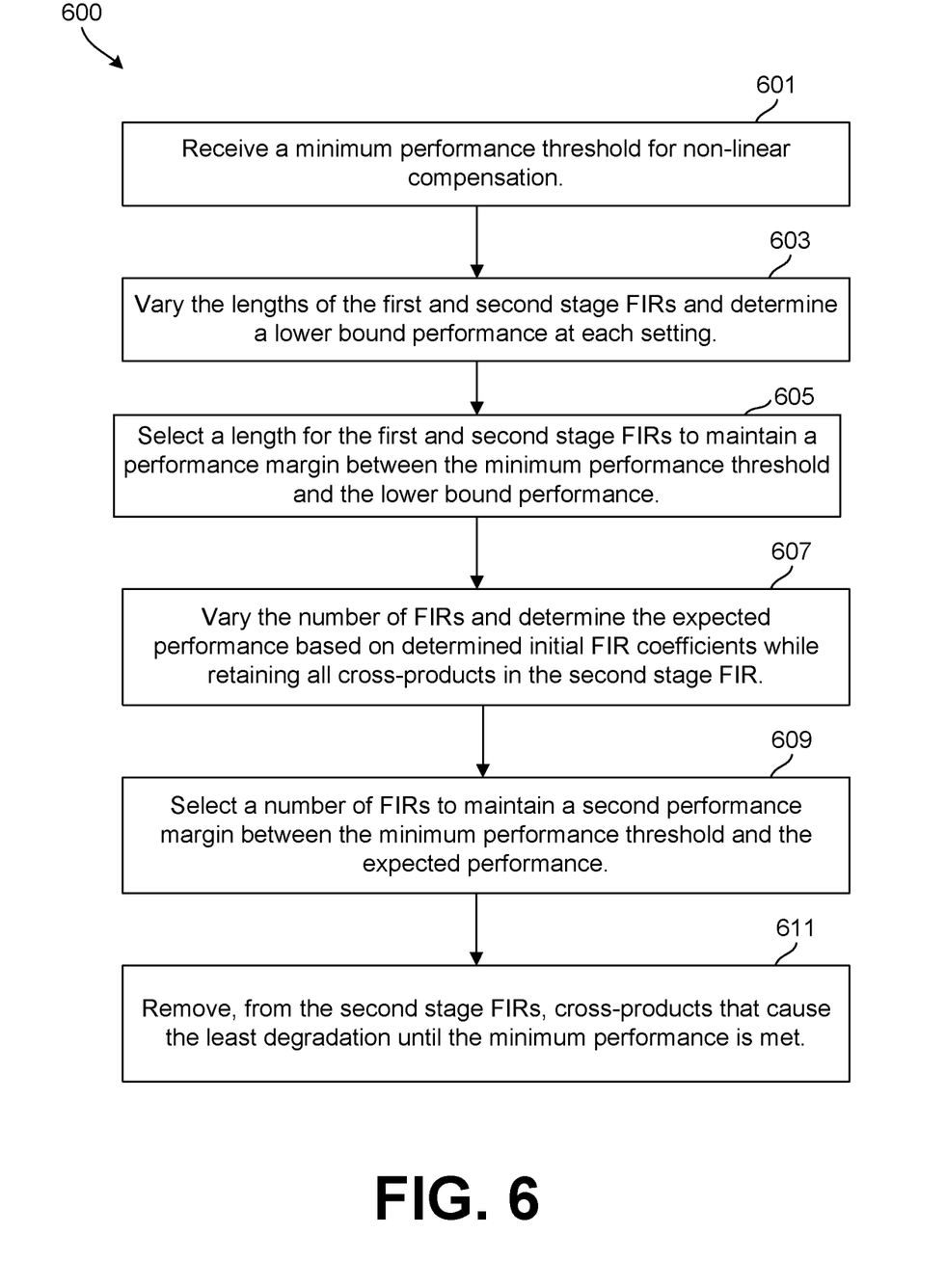
FIG. 6 is a flowchart of an example method for optimizing a LNL compensator by determining a length and number of FIR filters.

Hence the right side of the Equation 27 establishes the lower bound on the function $F_c(A, B^{\{l\}}, S^{\{l\}})$ to be minimized. This lower bound can be calculated for different values of number and length of FIR filters in the linear stages of the LNL compensator and thus suggests the minimum number of filters and their lengths in the LNL compensator structure. Based on the forgoing, method 600 may be employed to jointly determine a length and number of first stage and second stage FIR filters in an LNL compensator as discussed below.

FIG. 6 is a flowchart of an example method 600 for optimizing a LNL compensator, such as LNL compensator 120 and/or 420, by determining a length and number of FIR filters. Method 600 may be employed in conjunction with and/or subsequent to method 500. Accordingly, calibration signals may be applied to an ADC input in a test and measurement system prior to initiating method 600. Further, non-linear signal components in an ADC output may also be compared to non-linear filter components at a LNL compensator that includes first stage FIR filters and second stage FIR filters. This results in model of equations for the LNL compensator that can be optimized by method 600. As noted above, the model of equations for the LNL compensator maybe arranged according to a least mean squared formulation.

At block 601, a minimum performance threshold is received for the LNL compensator.

The minimum performance threshold may be received from a user. For example, the minimum performance threshold may indicate an amount of non-linear variance is that is acceptable in during conversion of an analog signal into a digital signal by an ADC. Stated another way, the minimum performance threshold indicates an amount of variance allowed between Equations 1 and 2 for a particular application.

At blocks 603 and 605, the lengths for the first stage FIR filters and the lengths for the second stage FIR filters in the LNL compensator are jointly determined to meet the minimum performance threshold received at block 601. Specifically, at block 603 the lengths for the first stage FIR filters and the length for the second stage FIR filters, as modeled by the calibrated equations of method 500, are varied to determine lower bound performances at each setting. Then, at block 605, lengths are selected for the first stage FIR filters and for the second stage FIR filters. Specifically, the lengths are selected to maintain a first performance margin between the minimum performance threshold and the lower bound performance. In other words, the lengths of first stage FIR filters and the second stage FIR filters are shortened until additional shortening would result in LNL compensator performance dropping below the minimum performance threshold plus the first performance margin. The first performance margin may be received from a user. By maintaining the first performance margin between the minimum performance threshold and the lower bound performance, an additional margin is available for further optimization as discussed below.

At blocks 607 and 609 a number of the first stage FIR filters and a number of the second stage FIR filters are jointly determined to meet the minimum performance threshold of block 601. For example, the number of the first stage FIR filters and the number of second stage FIR filters are varied to determine an expected performance. The expected performance is determined based on the calibrated system of equations as modified by the initial FIR coefficients determined in method 500 and as modified by the filter lengths determined at block 605. It should be noted that the second stage FIR filters include various cross-products. All cross-products may be retained at block 607. Then, at block 609, a number of the first stage FIR filters and a number of the second stage FIR filters are selected to maintain a second performance margin between the minimum performance threshold and the expected performance. In other words, the number of parallel first stage FIR filters and the number of parallel second stage FIR filters are reduced until further reduction would cause the expected performance to drop below the minimum performance threshold plus the second performance margin. The second performance margin may be received from a user. Further, the second performance margin may be less than the first performance margin.

At block 611, cross-products from the second stage FIR filters are removed until the minimum performance threshold is met. For example, the cross-products may be ordered based on the degradation that removing each cross-product would cause. The cross-products that cause the least degradation can then be sequentially removed until the minimum performance threshold is met. In other words, the cross-products may be sequentially removed until removing a further cross-product would cause the expected performance to drop below the minimum performance threshold. This approach results in removing as much of the complexity of the second stage FIRs as is possible while still maintaining the expected performance above the minimum performance threshold.

It should be note that when $(A, B^{\{l\}}, S^{\{l\}})$, which describes the first stage FIR filter coefficients A, the second stage FIR filter coefficients B, and the nonlinear filter coefficients S, exists such that $z_0 = g(A, B^{\{l\}}, S^{\{l\}})$, then $F_c(A, B^{\{l\}}, S^{\{l\}})$ reaches a lower bound (e.g. the right side of Equation 27). Generally this is not the case. It should also be noted that multiple algorithms may be employed to minimize $F_c(A, B^{\{l\}}, S^{\{l\}})$. One possible approach is to minimize the following expression instead:

$$U(A, B^{\{l\}}, S^{\{l\}}) = \|z_0 - g(A, B^{\{l\}}, S^{\{l\}})\|_2^2, \qquad \text{Equation 28}$$

This approach can be employed for initial estimation of A, $B^{\{l\}}$, $S^{\{l\}}$, coefficients (e.g. per block 511 of method 500), but may not operates as an optimized solution because there may exist different sets of matrixes $(A, B^{\{l\}}, S^{\{l\}})$ such that:

$$\|Wg(A_2, B_2^{\{l\}}, S_2^{\{l\}}) - d\|_2^2 < \|Wg(A_1, B_1^{\{l\}}, S_1^{\{l\}}) - d\|_2^2, \qquad \text{Equation 29}$$

$$\|z_0(A_2, B_2^{\{l\}}, S_2^{\{l\}})\|_2^2 > \|z_0 - g(A_1, B_1^{\{l\}}, S_1^{\{l\}})\|_2^2, \qquad \text{Equation 30}$$

This scenario may occur if the curvature of the function $\hat{F}_c(z)$ in its minimum point $z_0$ is larger in the direction from $z_0$ to $z_1 = g(A_1, B_1^{\{l\}}, S_1^{\{l\}})$ compared to the curvature of $\hat{F}_c(z)$ from $z_0$ to $z_2 = g(A_2, B_2^{\{l\}}, S_2^{\{l\}})$.

Curvature of a function is characterized through the functions Hessian matrix. For example, the direction of the maximum/minimum curvature is aligned with the eigenvector of the Hessian matrix corresponding to the largest/smallest eigenvalue. A Hessian matrix for the quadratic form as shown in Equation 25 is Real$\{W^H W\}$ with z acting as an independent variable. A Taylor series expansion for Equation 25 around the minimum point $z_0$ is:

$$\hat{F}_c(z) = \hat{F}_c(z_0) + 0.5(z - z_0)^T \text{Real}\{W^H W\}(z - z_0), \qquad \text{Equation 31}$$

Equation 32 below may be inserted in Equation 31:

$$z = g(A, B^{\{l\}}, S^{\{l\}}), \qquad \text{Equation 32}$$

which replaces the optimization function $F_c(A, B^{\{l\}}, S^{\{l\}})$ of Equation 21 with a simpler optimization function shown as Equation 33 below:

$$V(A, B^{\{l\}}, S^{\{l\}}) = \hat{F}_c(g(A, B^{\{l\}}, S^{\{l\}})) - \hat{F}_c(z_0) = 0.5(g(A, B^{\{l\}}, S^{\{l\}}) - z_0)^T \text{Real}\{W^H W\}(g(A, B^{\{l\}}, S^{\{l\}}) - z_0), \qquad \text{Equation 33}$$

It should be noted that the optimization function of Equation 33 can be farther simplified using eigenvalue decomposition for the positive definite matrix Real$\{W^H W\}$ resulting in:

$$\text{Real}\{W^H W\} = EDE^T = ED^{0.5}(ED^{0.5})^T, \qquad \text{Equation 34}$$

where a diagonal matrix D can be reduced to a diagonal matrix of lower order by keeping only significant eigenvalues and keeping in matrix E the corresponding eigenvectors only.

Equations 33 and 34 allow a formulation of LNL compensator according to a least squares optimization problem since:

$$V(A, B^{\{l\}}, S^{\{l\}}) = \sum_{i=1}^{I} V_i^2(A, B^{\{l\}}, S^{\{l\}}), \qquad \text{Equation 35,}$$

$$V_i(A, B^{\{l\}}, S^{\{l\}}) = \rho^{(i)}(ED^{0.5})^T(g(A, B^{\{l\}}, S^{\{l\}}) - z_0), \qquad \text{Equation 36}$$

where $\rho^{(i)}$ is a row vector with the only non zero entry 1 in the i-th position.

Once the least square optimization problem is formulated, any iterative algorithm, such as Levenberg-Marquardt, can be applied. Such algorithms may employ knowledge of a Jacobian matrix and an initial point of iteration to operate. A Jacobian matrix may be defined according to:

$$J_{it} = \frac{\partial V_i(A, B^{\{l\}}, S^{\{l\}})}{\partial x_t}, \qquad \text{Equation 37}$$

with all variables given by the entries of matrixes A, $B^{\{l\}}$ being collected into the vector x:

$$x_t = \begin{cases} A_{qm}, & t = (q-1)M + m; q = 1, 2, \ldots, Q; m = 1, 2, \ldots, M \\ B^{(l)}_{r(q_1 \ldots q_l),k}, & t = QM + R^{(l-1)}K + \\ & (r(q_1 \ldots q_l) - 1)K + k; k = 1, 2, \ldots, K \end{cases}, \qquad \text{Equation 38}$$

where $r(q_1 \ldots q_l) \in \{1, 2, \ldots, R^{(l)}\}$ is an enumeration of L tuples with a restriction $q_1 \geq q_2 \geq \ldots \geq q_l$ for $q_n \in \{1, 2, \ldots, Q\}$; $n = 1, 2, \ldots, l$ and $R^{(l)}$ is the number of l-th order non-linear products created by the memoryless non-linear block (e.g. non-linear filter 125, 225, 425 and/or 300) of an LNL compensator.

Figure 7:
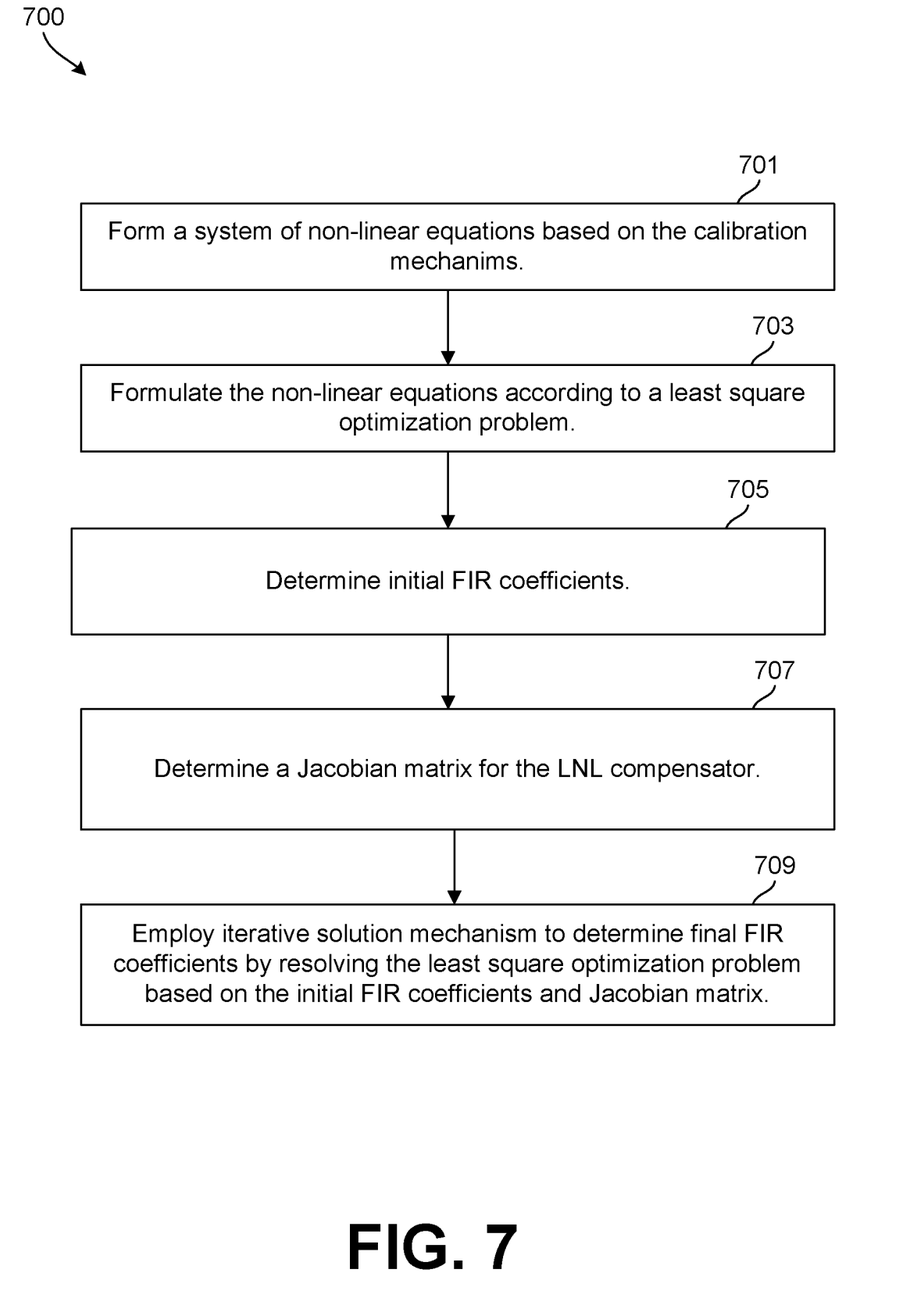
FIG. 7 is a flowchart of an example method for determining FIR coefficients for an LNL compensator.

A cross-product array $S^{\{l\}}$ may be generated by method 700 as discussed above. Based on Equations 36-37:

$$J = (ED^{0.5})^T G, \qquad \text{Equation 39}$$

with a matrix G having entries according to:

$$G_{pt} = \frac{\partial g_p(A, B^{\{l\}}, S^{\{l\}})}{\partial x_t}, \qquad \text{Equation 40}$$

Accordingly, $G_{pt}$ can be computed. It should be noted that a column vector $g(A, B^{\{l\}}, S^{\{l\}})$ includes concatenated column sub-vectors $g(A, B^{(l)}, S^{(l)})$ according to Equation 23 each having the length $KM^l$. The index p of the l-th subvector extends from $KM^2(M^{l-2})/(M-1)+1$ to $KM^2(M^{l-1})/(M-1)$, and employing some enumeration for the l+1 tuple $p_0, p_1, \ldots, p_l$ results in $$p = \frac{KM^2(M^{l-2})}{M - 1} + enum(p_0, p_1, \ldots, p_l), \qquad \text{Equation 41}$$

For these indexes p and for indexes $t \leq QM$ (e.g. see Equation 38):

$$G_{pt} = \frac{\partial g_p(A, B^{\{l\}}, S^{\{l\}})}{\partial A_{qm}} = \qquad \text{Equation 42}$$

$$\sum_{h=1}^{l} \delta(p_h, m) \sum_{q_1=1}^{Q} \sum_{q_2=1}^{q_1} \cdots \sum_{q_{h-1}=1}^{q_{h-2}} \sum_{q_{h+1}=1}^{q_h} \cdots$$

$$\sum_{q_l=1}^{q_{l-1}} S_{q_1 \ldots q_{h-1} q q_{h+1} \ldots q_l} A_{q_1 p_1} \cdots$$

$$A_{q_{h-1} p_{h-1}} A_{q_{h+1} p_{h+1}} \cdots A_{q_l p_l} B_{r p_0},$$

where $$\delta(s, m) = \begin{cases} 1, & \text{if } s = m \\ 0, & \text{if } s \neq m \end{cases}, \qquad \text{Equation 43}$$

For the same indexes p and for indexes $QM + R^{(l-1)}K < t < QM + R^{(l)}K$:

$$G_{pt} = \frac{\partial g_p(A, B^{\{l\}}, S^{\{l\}})}{\partial B^{(l)}_{r(q_1 \ldots q_l),k}} = \qquad \text{Equation 44}$$

$$\delta(p_0, k) \sum_{q_1=1}^{Q} \sum_{q_2=1}^{q_1} \cdots \sum_{q_l=1}^{q_{l-1}} S_{q_1 q_2 \ldots q_l} A_{q_1 p_1} A_{q_2 p_2} \cdots A_{q_l p_l},$$

Next a mechanism may be employed to of computing initial values of unknowns A, $B^{\{l\}}$, $S^{\{l\}}$ which may be employed as a starting point in the iteration process. $S^{\{l\}}$ may be chosen to be a diagonal unity array and A, $B^{\{l\}}$ may be an approximate solution of Equation 28 as described below. $g(A, B^{\{l\}}, S^{\{l\}})$ and $z_0$ may be defined by Equations 23 and 26, respectively. Their l-th subvectors may be denoted by g $(A, B^{(l)}, S^{(l)})$ and $z_0^{(l)}$. This may support a determination of an approximate solution the equations as shown below:

$$g(A, B^{(l)}, S^{(l)}) = z_0^{(l)}, l=2,3,\ldots,L,\qquad \text{Equation 45}$$

Components of vector $z_0^{(l)}$ can be rearranged into an l+1 dimensional array $Z_0^{(l)}$, for example with the indexes $p_0, p_1, p_2, \ldots, p_{l-1}, p_l$ by the enumeration of Equation 13 that was employed for the enumeration of components of vector $g(A, B^{(l)}, S^{(l)})$. Then taking into account the definition of $g(A, B^{(l)}, S^{(l)})$ by Equation 14 and by taking into account the unity diagonal assumption on $S^{(l)}$, Equation 45 can be re-written as multiple matrix equations:

$$A^T A_{p_2} \ldots A_{p_{l-1}} B_{p_0}^{(l)} A = Z_{p_0 p_2 \ldots p_{l-1}};$$

$$l=2,3,\ldots,L; p_0=1,2,\ldots,K; p_n=1,2,\ldots, M, n=2,\ldots,l-1,\qquad \text{Equation 46}$$

where A is the Q×M matrix of the first stage FIR coefficients of LNL compensator; $A^T$ is its transpose; $A_{p_n}$ and $B_{p_0}$ are Q×Q diagonal matrixes with diagonal entries $A(1, p_n), A(2, p_n), \ldots, A(Q, p_n)$ and $B(1, p_0), B(2, p_0), \ldots, B(Q, p_0)$; $Z_{p_0 p_2 \ldots p_{l-1}}^{(l)}$ is the M×M matrix derived from the l+1 dimensional array $Z_0^{(l)}$ by fixing its l-1 indexes $p_0 p_2 \ldots p_{l-1}$ out of l+1 indexes $p_0 p_1 p_2 \ldots p_{l-1} p_l$. Using eigenvalue decomposition on the right side of Equation 46, which is a symmetric matrix, and keeping only the largest Q out of M eigenvalues arranged in the Q×Q diagonal matrix $D_{p_0 p_2 \ldots p_{l-1}}^{(l)}$ and corresponding eigenvectors arranged into M×Q matrix $U_{p_0 p_2 \ldots p_{l-1}}^{(l)}$ results in:

$$A^T A_{p_2} \ldots A_{p_{l-1}} B_{p_0}^{(l)} A = U_{p_0 p_2 \ldots p_{l-1}}^{(l)} D_{p_0 p_2 \ldots p_{l-1}}^{(l)} U_{p_0 p_2 \ldots p_{l-1}}^{(l)T};$$

$$l=2,3,\ldots,L; p_0=1,2,\ldots,K; p_n=1,2,\ldots, M, n=2,\ldots,l-1,\qquad \text{Equation 47}$$

The solutions of Equation 47 may be approximated for first stage FIR coefficients by employing Equation 48:

$$A = \text{mean}(U_{p_0 p_2 \ldots p_{l-1}}^{(l)T});\qquad \text{Equation 48}$$

where the mean operation proceeds over all indexes l=2, 3, ..., L; $p_0=1,2,\ldots,K$; $p_n=1,2,\ldots,M$, n=2, 3, ..., l-1 and a solution for the second stage FIR coefficients $B_{p_0}^{(l)}$ is expressed by:

$$B_{p_0}^{(l)} = \text{mean}(D_{p_0 p_2 \ldots p_{l-1}}^{(l)}/A_{p_2} \ldots A_{p_{l-1}}),\qquad \text{Equation 49}$$

where a mean operation goes over indexes $p_n=1,2,\ldots,M$, n=2,3, ..., l-1. A FIR coefficients optimization procedure based on the foregoing is disclosed as method 700 below.

FIG. 7 is a flowchart of an example method 700 for determining FIR coefficients for an LNL compensator, such as LNL compensator 120 and/or 420. Method 700 may be employed in conjunction with and/or subsequent to methods 500 and 600. Accordingly, a system of non-linear equations is formed based on the calibration mechanism of method 500. In other words, calibration signals may be applied to an ADC input in a test and measurement system. As noted above, the LNL compensator may include one or more first stage FIR filter(s), a non-linear filter coupled to the first stage FIR filter(s), and at least one second stage FIR filter coupled to the non-linear filter. Method 700, in conjunction with methods 500 and/or 600, jointly determines final filter coefficients for the first stage FIR filters and second stage FIR filters.

At block 703, non-linear equations are formulated for the LNL compensator according to a least square optimization problem. In other words, non-linear signal components in a signal output from the ADC output are compared to non-linear filter components at a LNL compensator. This formulation may be accomplished according to Equations 31, 32, 33, 34, 35, and 36 as discussed above. Also, as discussed above, block 703 may include receiving a minimum performance threshold for the LNL compensator, and jointly determining lengths for first stage FIR filters and lengths for second stage FIR filters to meet the minimum performance threshold as discussed with respect to method 600. In addition, block 703 may include jointly determining a number of the first stage FIR filters and a number of the second stage FIR filters to meet the minimum performance threshold per method 600. Further, block 703 may also include removing cross-products from the second stage FIR filters until the minimum performance threshold is met as discussed above.

At block 705, initial FIR coefficients for the first stage FIR filters and the second stage FIR filters are determined. In other words, the comparison of the non-linear signal components to the non-linear filter components may be employed to determine initial filter coefficients for FIR filters in the LNL. The initial solution of the FIR coefficients may be determined according to Equations 45, 46, 47, 48, and 49 above. In another example, random FIR coefficients may be employed to act as an initial solution for further computation. Such FIR coefficients are replaced by final FIR coefficients as discussed below.

At block 707, a Jacobian matrix may be determined for the LNL compensators. For example, the Jacobian matrix may be determined according to Equations 37, 38, 39, 40, 41, 42, 43, and 44 as discussed above. It should be noted that blocks 705 and 707 may be completed in any order and/or may be completed in parallel.

At block 709, an iterative solution mechanism is employed to determine the final FIR coefficients. For example, the initial filter coefficients and the Jacobian matrix may be employed to determine final filter coefficients for the FIR filters in the LNL. As noted above, the LNL compensator is modeled/formulated as a system of non-linear equations in a least square optimization formulation/problem at block 703. Such a problem may be resolved by employing iterative solution algorithms, particularly when an initial solution and a Jacobian matrix are available (e.g. as determined by blocks 705 and 707). As a particular example, a Levenberg-Marquardt algorithm can be employed to resolve the system of non-linear equations to obtain the final filter coefficients for the first stage and second stage FIR filters in the LNL compensator. It should be noted that once the relevant filter coefficients have been determined by block 709, a DSP or other signal processor in the test and measurement system can be set to implement the LNL compensator and perform non-linear filtration of an ADC output.

Figure 8:
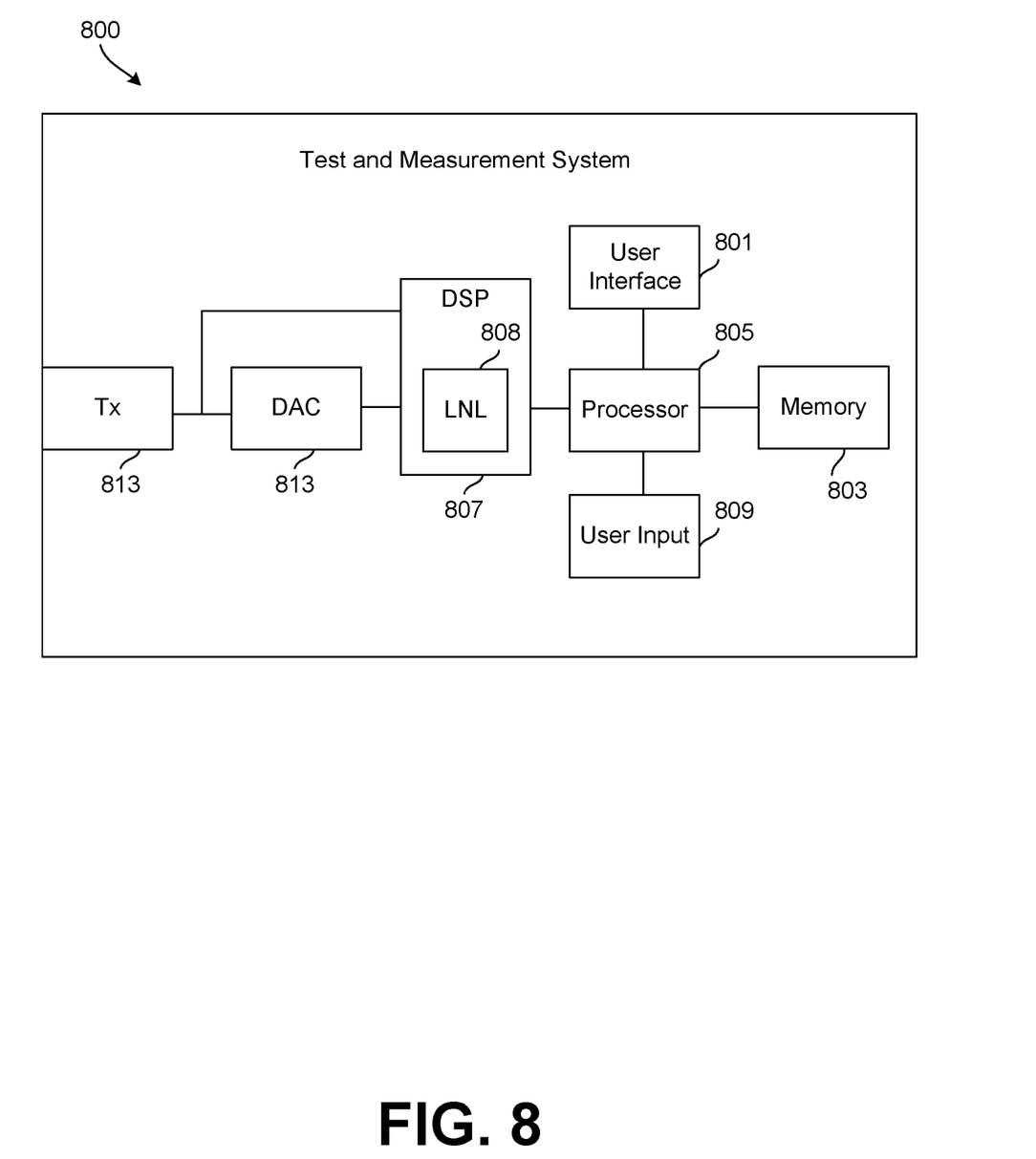
FIG. 8 is a schematic diagram of an example test and measurement system employing a LNL compensator to pre-compensate for a digital to analog converter (DAC).

FIG. 8 is a schematic diagram of an example test and measurement system 800 employing a LNL compensator 808 to pre-compensate for a digital to analog converter (DAC) 813. For example, the system 800 may be an arbitrary waveform generator. The LNL compensator 808 may be substantially similar to the LNL compensator 120 and/or 420. However, the LNL compensator 808 may be employed to pre-compensate for non-linear signal components created by the DAC 813. As such, the LNL compensator 808 may be configured based on methods 500, 600, and/or 700 as discussed above.

The system 800 includes a user interface 801, which is any device capable of providing feedback to a user. For example, the user interface 801 may include a screen, touch screen, speakers, etc. The system 800 also includes a user input 809, which may be any device capable of receiving user input. For example, the user input 809 may include a touch screen, buttons, mouse, trackball, keyboard, network interface, etc. The user interface 801 and the user input 809 are coupled to a processor 805, and hence allow the user to interact with the system 800. The processor 805 is any processing circuit capable of controlling system 800 and executing commands based on user input. The processor 805 may be implemented as a ASIC, FPGA, DSP, or other processing circuit. The processor 805 is coupled to memory 803. The memory 803 is any computer-readable storage device capable of storing instructions to be executed by the processor 805. For example, the memory 803 may include cache, RAM, ROM, flash memory, solid state memory, EEPROM, etc. As a specific example, memory 803 may contain a computer program product containing instructions that, when executed, cause the processor to implement methods 500, 600, and/or 700 on the DAC 813 and the LNL compensator 808. As another example, the processor 805 may implement methods 500, 600, and/or 700 on the DAC 813 and the LNL compensator 808.

The DSP 807 may be any processing circuit capable of processing signals. In some examples, the processor 805 is combined with the DSP 807. The DSP 807 implements LNL compensator 808 to pre-compensate for non-linear signal errors related to DAC 813. Further, the DSP 807 may generate digital signals based on instructions from the processor 805. Such signals are then forwarded to the DAC 813. The DAC 813 is any device capable of converting digital signals into analog signals. The DAC 813 may forward the converted analog signals to a transmitter (tx) 813. Tx 813 may be any wired, wireless, and/or optical device capable of forwarding the analog signal toward a DUT and/or other testing systems. For example, the tx 813 may include a port configured to receive a cable for use as a medium for transmitting a signal from the DAC 813.

By employing the methods discussed above, the processor 805 may cause the DSP 808 to apply calibration signals to the DAC 813. The DSP 808 may then measure the results on the DAC 813 output. Such measurements may be converted back into a digital by a ADC in some examples. The DSP 807 may then determine the filter coefficients for first stage FIR filters, second stage FIR filters, and/or non-linear filters as discussed above. The DSP 808 can then implement the LNL compensator 808 based on the determined coefficients. Accordingly, the disclosed mechanisms may be applied to generate a LNL compensator for a signal converter that includes an ADC, a DAC, or combinations thereof.

Examples of the disclosure may operate on a particularly created hardware, on firmware, digital signal processors, or on a specially programmed computer including a processor operating according to programmed instructions. The terms "controller" or "processor" as used herein are intended to include microprocessors, microcomputers, ASICs, and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer readable storage medium such as a hard disk, optical disk, removable storage media, solid state memory, Electrically Erasable Programmable Read-Only Memory (EEPROM), Random Access Memory (RAM), etc. As will be appreciated by one of skill in the art, the functionality of the program modules may be combined or distributed as desired in various examples. In addition, the functionality may be embodied in whole or in part in firmware or hardware equivalents such as integrated circuits, field programmable gate arrays (FPGA), and the like. Particular data structures may be used to more effectively implement one or more aspects of the disclosure, and such data structures are contemplated within the scope of computer executable instructions and computer-usable data described herein.

Aspects of the present disclosure operate with various modifications and in alternative forms. Specific aspects have been shown by way of example in the drawings and are described in detail herein below. However, it should be noted that the examples disclosed herein are presented for the purposes of clarity of discussion and are not intended to limit the scope of the general concepts disclosed to the specific examples described herein unless expressly limited. As such, the present disclosure is intended to cover all modifications, equivalents, and alternatives of the described aspects in light of the attached drawings and claims.

References in the specification to embodiment, aspect, example, etc., indicate that the described item may include a particular feature, structure, or characteristic. However, every disclosed aspect may or may not necessarily include that particular feature, structure, or characteristic. Moreover, such phrases are not necessarily referring to the same aspect unless specifically noted. Further, when a particular feature, structure, or characteristic is described in connection with a particular aspect, such feature, structure, or characteristic can be employed in connection with another disclosed aspect whether or not such feature is explicitly described in conjunction with such other disclosed aspect.

The disclosed aspects may be implemented, in some cases, in hardware, firmware, software, or any combination thereof. The disclosed aspects may also be implemented as instructions carried by or stored on one or more or computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include Random Access Memory (RAM), Read Only Memory (ROM), Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information.

By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the technologies disclosed herein are provided below. An embodiment of the technologies may include any one or more, and any combination of, the examples described below.

Example 1 includes a method comprising: applying calibration signals to a signal converter input in a test and measurement system; measuring signal output from the signal converter; determining non-linear signal components in the signal output; modeling non-linear filter components at a Linear, Memory-less Non-linear, Linear (LNL) compensator based on the calibration signals; comparing the non-linear signal components to the non-linear filter components; and resolving the comparison of the non-linear signal components to the non-linear filter components to determine filter coefficients for first stage Finite Impulse Response (FIR) filters and second stage FIR filters in the LNL compensator.

Example 2 includes the method of Example 1, wherein the LNL compensator includes a plurality of ordered branches, each order branch including a first stage FIR filter, a non-linear filter, and a second stage FIR filter.

Example 3 includes the method of any of Examples 1-2, wherein each order branch is configured to filter out a corresponding order of non-linear signal components.

Example 4 includes the method of Example 1, wherein the LNL compensator includes a single first stage FIR filter and a plurality of ordered branches, each order branch including a non-linear filter and a second stage FIR filter.

Example 5 includes the method of any of Examples 1-4, wherein the calibration signals include mixtures of sine wave tones at a plurality of frequency indexes.

Example 6 includes the method of any of Examples 1-5, wherein modeling the non-linear filter components includes modeling the first stage FIR filters and the second stage FIR filters as a series of unknown FIR coefficients.

Example 7 includes the method of any of Examples 1-6, wherein comparing the non-linear signal components to the non-linear filter components includes comparing the non-linear signal components to the non-linear filter components according to a least mean squared formulation.

Example 8 includes a method comprising: applying calibration signals to a signal converter input in a test and measurement system; comparing non-linear signal components in a signal converter output to non-linear filter components at a Memory-less Non-linear (LNL) compensator, the LNL compensator including first stage Finite Impulse Response (FIR) filters and second stage FIR filters; receiving a minimum performance threshold for the LNL compensator; determining lengths for the first stage FIR filters and lengths for the second stage FIR filters to meet the minimum performance threshold; and determining a number of the first stage FIR filters and a number of the second stage FIR filters to meet the minimum performance threshold.

Example 9 includes the method of Example 8, wherein determining the lengths for the first stage FIR filters and the length for the second stage FIR filters includes: varying the lengths for the first stage FIR filters and the length for the second stage FIR filters to determine lower bound performances; and selecting the lengths for the first stage FIR filters and the length for the second stage FIR filters to maintain a first performance margin between the minimum performance threshold and the lower bound performance.

Example 10 includes the method of any of Examples 8-9, wherein determining the number of the first stage FIR filters and the number of the second stage FIR filters includes: varying the number of first stage FIR filters and the number of second stage FIR filters to determine an expected performance; and selecting the number of the first stage FIR filters and the number of the second stage FIR filters to maintain a second performance margin between the minimum performance threshold and the expected performance.

Example 11 includes the method of any of Examples 8-10, further comprising removing cross-products from the second stage FIR filters until the minimum performance threshold is met.

Example 12 includes the method of Example 11, wherein removing the cross-products from the second stage FIR filters includes: ordering the cross-products based on degradation; and removing the cross-products that cause the least degradation until the minimum performance threshold is met.

Example 13 includes the method of any of Examples 8-12, wherein comparing the non-linear signal components to the non-linear filter components includes comparing the non-linear signal components to the non-linear filter components according to a least mean squared formulation.

Example 14 includes a computer program product stored in a medium that, when executed by a processor, causes the processor to: apply calibration signals to a signal converter input in a test and measurement system; compare non-linear signal components at a Linear, Memory-less Non-linear, Linear (LNL) compensator to the non-linear filter components in signal output from the signal converter; employ the comparison of the non-linear signal components to the non-linear filter components to determine initial filter coefficients for Finite Impulse Response (FIR) filters in the LNL compensator; determine a Jacobian matrix for the LNL compensator; and employ the initial filter coefficients and the Jacobian matrix to determine final filter coefficients for the FIR filters in the LNL compensator.

Example 15 includes the computer program product of Example 14, wherein the final filter coefficients for the FIR filters in the LNL compensator are determined by formulating the comparison of the non-linear signal components to the non-linear filter components as a least square optimization.

Example 16 includes the computer program product of any of Examples 14-15, wherein the LNL compensator includes a first stage FIR filter, a non-linear filter coupled to the first stage FIR filter, and at least one second stage FIR filter coupled to the non-linear filter, and final filter coefficients for the first stage FIR filters and second stage FIR filters are simultaneously determined.

Example 17 includes the computer program product of any of Examples 14-16, wherein the computer program product further causes the processor to: receive a minimum performance threshold for the LNL compensator; and simultaneously determine lengths for first stage FIR filters and lengths for second stage FIR filters to meet the minimum performance threshold.

Example 18 includes the computer program product of any of Examples 14-17, wherein the computer program product further causes the processor to simultaneously determine a number of the first stage FIR filters and a number of the second stage FIR filters to meet the minimum performance threshold.

Example 19 includes the computer program product of any of Examples 14-18, wherein the computer program product further causes the processor to remove cross-products from the second stage FIR filters until the minimum performance threshold is met.

Example 20 includes the computer program product of any of Examples 14-19, wherein the processor operates in an oscilloscope, an arbitrary waveform generator (AWG), a transmitter (TX), or combination thereof.

The previously described versions of the disclosed subject matter have many advantages that were either described or would be apparent to a person of ordinary skill. Even so, all of these advantages or features are not required in all versions of the disclosed apparatus, systems, or methods.

Additionally, this written description makes reference to particular features. It is to be understood that the disclosure in this specification includes all possible combinations of those particular features. For example, where a particular feature is disclosed in the context of a particular aspect, that feature can also be used, to the extent possible, in the context of other aspects.

Also, when reference is made in this application to a method having two or more defined steps or operations, the defined steps or operations can be carried out in any order or simultaneously, unless the context excludes those possibilities.

Although specific aspects of the invention have been illustrated and described for purposes of illustration, it will be understood that various modifications may be made without departing from the spirit and scope of the invention. Accordingly, the invention should not be limited except as by the appended claims.

We claim:

1. A method comprising:
applying calibration signals to a signal converter input in a test and measurement system;
measuring signal output from the signal converter;
performing at least one of spectral and amplitude analysis on the signal output;
determining non-linear signal components in the signal output from the at least one of spectral and amplitude analysis;
modeling non-linear filter components at a Linear, Memory-less Non-linear, Linear (LNL) compensator based on the calibration signals;
comparing the non-linear signal components to the non-linear filter components; and
resolving the comparison of the non-linear signal components to the non-linear filter components to determine filter coefficients for first stage Finite Impulse Response (FIR) filters and second stage FIR filters in the LNL compensator.

2. The method of claim 1, wherein the LNL compensator includes a plurality of ordered branches, each order branch including a first stage FIR filter, a non-linear filter, and a second stage FIR filter.

3. The method of claim 2, wherein each order branch is configured to filter out a corresponding order of non-linear signal components.

4. The method of claim 1, wherein the LNL compensator includes a single first stage FIR filter and a plurality of ordered branches, each order branch including a non-linear filter and a second stage FIR filter.

5. The method of claim 1, wherein the calibration signals include mixtures of sine wave tones at a plurality of frequency indexes.

6. The method of claim 1, wherein modeling the non-linear filter components includes modeling the first stage FIR filters and the second stage FIR filters as a series of unknown FIR coefficients.

7. The method of claim 1, wherein comparing the non-linear signal components to the nonlinear filter components includes comparing the non-linear signal components to the non-linear filter components according to a least mean squared formulation.

8. A method comprising:
applying calibration signals to a signal converter input in a test and measurement system;
measuring signal output from the signal converter;
performing at least one of spectral and amplitude analysis on the signal output;
determining non-linear signal components in the signal output from the at least one of spectral and amplitude analysis;
comparing non-linear signal components in a signal converter output to non-linear filter components at a Linear, Memory-less Non-linear, Linear (LNL) compensator, the LNL compensator including first stage Finite Impulse Response (FIR) filters and second stage FIR filters;
receiving a minimum performance threshold for the LNL compensator;
determining lengths for the first stage FIR filters and lengths for the second stage FIR filters to meet the minimum performance threshold; and
determining a number of the first stage FIR filters and a number of the second stage FIR filters to meet the minimum performance threshold.

9. The method of claim 8, wherein determining the lengths for the first stage FIR filters and the length for the second stage FIR filters includes:
varying the lengths for the first stage FIR filters and the length for the second stage FIR filters to determine lower bound performances; and
selecting the lengths for the first stage FIR filters and the length for the second stage FIR filters to maintain a first performance margin between the minimum performance threshold and the lower bound performance.

10. The method of claim 8, wherein determining the number of the first stage FIR filters and the number of the second stage FIR filters includes:
varying the number of first stage FIR filters and the number of second stage FIR filters to determine an expected performance; and
selecting the number of the first stage FIR filters and the number of the second stage FIR filters to maintain a second performance margin between the minimum performance threshold and the expected performance.

11. The method of claim 8, further comprising removing cross-products from the second stage FIR filters until the minimum performance threshold is met.

12. The method of claim 11, wherein removing the cross-products from the second stage FIR filters includes:
ordering the cross-products based on degradation; and
removing the cross-products that cause the least degradation until the minimum performance threshold is met.

13. The method of claim 8, wherein comparing the non-linear signal components to the nonlinear filter components includes comparing the non-linear signal components to the non-linear filter components according to a least mean squared formulation.

14. A non-transitory computer-readable storage medium having instructions embodied thereon that, when executed by a processor, cause a processor to:
- apply calibration signals to a signal converter input in a test and measurement system;
- measuring signal output from the signal converter;
- performing at least one of spectral and amplitude analysis on the signal output;
- determining non-linear signal components in the signal output from the at least one of spectral and amplitude analysis;
- compare non-linear signal components at a Linear, Memory-less Non-linear, Linear (LNL) compensator to the non-linear filter components in signal output from the signal converter;
- employ the comparison of the non-linear signal components to the non-linear filter components to determine initial filter coefficients for Finite Impulse Response (FIR) filters in the LNL compensator;
- determine a Jacobian matrix for the LNL compensator; and
- employ the initial filter coefficients and the Jacobian matrix to determine final filter coefficients for the FIR filters in the LNL compensator.

15. The non-transitory computer-readable storage medium of claim 14, wherein the final filter coefficients for the FIR filters in the LNL compensator are determined by formulating the comparison of the non-linear signal components to the non-linear filter components as a least square optimization.

16. The non-transitory computer-readable storage medium of claim 14, wherein the LNL compensator includes a first stage FIR filter, a non-linear filter coupled to the first stage FIR filter, and at least one second stage FIR filter coupled to the non-linear filter, and final filter coefficients for the first stage FIR filters and second stage FIR filters are simultaneously determined.

17. The non-transitory computer-readable storage medium of claim 14, wherein the computer program product further causes the processor to:
- receive a minimum performance threshold for the LNL compensator; and
- simultaneously determine lengths for first stage FIR filters and lengths for second stage FIR filters to meet the minimum performance threshold.

18. The non-transitory computer-readable storage medium of claim 17, wherein the computer program product further causes the processor to simultaneously determine a number of the first stage FIR filters and a number of the second stage FIR filters to meet the minimum performance threshold.

19. The non-transitory computer-readable storage medium of claim 17, wherein the computer program product further causes the processor to remove cross-products from the second stage FIR filters until the minimum performance threshold is met.

20. The non-transitory computer-readable storage medium of claim 14, wherein the processor operates in an oscilloscope, an arbitrary waveform generator (AWG), a transmitter (TX), or combination thereof.

* * * * *